United States Patent [19]

Kwon et al.

[11] Patent Number: 5,777,931
[45] Date of Patent: Jul. 7, 1998

[54] SYNCHRONIZED REDUNDANCY DECODING SYSTEMS AND METHODS FOR INTEGRATED CIRCUIT MEMORY DEVICES

[75] Inventors: Ig-Soo Kwon, Kyungki-do; Chul-Min Jung, Seoul, both of Rep. of Korea

[73] Assignee: Samsung Electronics Co., Ltd., Suwon, Rep. of Korea

[21] Appl. No.: 703,204

[22] Filed: Aug. 26, 1996

[30] Foreign Application Priority Data

Aug. 25, 1995 [KR] Rep. of Korea .................. 1995/26602

[51] Int. Cl.$^6$ .................................................. G11C 7/00
[52] U.S. Cl. .................. 365/200; 365/230.06; 365/225.7
[58] Field of Search ........................... 365/200, 230.06, 365/230.08, 225.7; 371/10.1, 10.2, 10.3

[56] References Cited

U.S. PATENT DOCUMENTS 5,282,165  1/1994  Miyake ............................ 365/200
5,457,656  10/1995 Fu ................................... 365/200
5,544,106  8/1996  Koike .............................. 365/200

*Primary Examiner*—David C. Nelms
*Assistant Examiner*—Son Mai
*Attorney, Agent, or Firm*—Myers Bigel Sibley & Sajovec

[57] ABSTRACT

Redundancy decoding systems and methods for integrated circuit memory devices synchronize a redundancy decoding signal to allow the redundancy decoding signal to be output during an enabling period and to prevent output of the redundancy decoding signal otherwise. In particular, a redundancy decoder is synchronized to an output buffer so that the redundancy decoder generates a redundancy decoding signal during a time period which is independent of the identity of the programmed address. Accordingly, high speed selection of a redundancy word line is provided in synchronism with the conventional word line selection, so that address skew and improper operation of the redundancy system relative to the normal word line selection system is prevented.

15 Claims, 8 Drawing Sheets

SYNCHRONIZED REDUNDANCY DECODING SYSTEMS AND METHODS FOR INTEGRATED CIRCUIT MEMORY DEVICES

FIELD OF THE INVENTION

This invention relates to integrated circuit memory devices, and more particularly to integrated circuit memory devices having redundancy to replace defective memory cells with redundant memory cells.

BACKGROUND OF THE INVENTION

In order to improve the yield of integrated circuit memory devices, it is known to provide redundant memory cells, and to replace defective memory cells with redundant memory cells, so that an operative device is obtained. As the integration density of memory devices continues to increase, it generally becomes increasingly important to provide redundancy systems and methods, in order to produce acceptable device yields. However, as the speed of memory devices also increases, the redundancy systems may cause timing problems.

FIG. 1 is a block diagram of a redundancy decoding system which selects a normal word line and a redundancy word line in a conventional semiconductor memory device. First, describing the selection of the normal word line, an address buffer 11 synchronizes a received address XAi to a synchronous signal KFRST, to thereby output an address signal Ai therefrom. A decoder 12 decodes the address signal Ai, to thereby generate a decoding signal Pi. A main word line decoder 13 synchronizes the decoding signal Pi to a synchronous signal KSCND1, thereby to select a corresponding normal word line MWL.

Still referring to FIG. 1, in order to select a redundancy word line, an address buffer 14 synchronizes an inputted address XAi to the synchronous signal KFRST, to thereby output a redundancy address signal RAi therefrom. A redundancy decoder 15 decodes the redundancy address RAi, to thereby output a redundancy decoding signal RPi therefrom. A redundancy main word line decoder 16 synchronizes the redundancy decoding signal RPi to the synchronous signal KSCND1, to thereby select a corresponding redundancy word line RMWL. It will be understood by those having skill in the art that although two separate address buffers 14 and 15 are illustrated in FIG. 1, a single address buffer can be used to synchronize a received address XAi to a synchronous signal KFRST.

Since the redundancy decoder 15 and the decoder 12 have different circuit construction, the redundancy decoder 15 and the decoder 12 have different delay times of τi and τ3, respectively, to decode the redundancy address RAi and the address Ai. Accordingly, it respectively takes times of τ2 and τ4 to select the redundancy word line RMWL and the normal word line MWL.

FIG. 2 is a schematic diagram of the redundancy decoder 15 of FIG. 1. A fuse FE is blown or programmed when a corresponding redundancy decoder 15 is programmed. Accordingly, the fuse FE, a resistor R1, an MOS capacitor C1, an inverter I1, an NMOS transistor N2 and a PMOS transistor P2 which are connected to a node ZFE, indicate whether the redundancy decoder 15 is programmed. Also, a PMOS transistor P1 and an NMOS transistor N1 connected to a node ZRR are switched in response to a signal ZZPD which is activated in an enabling mode, to thereby indicate the state of the node ZRR. The fuses Fi1 and Fi2 (i=0,1,2, . . . , n) are elements for programming the redundancy address RPi, in order to select the redundancy word line for defect repair. The NMOS transistors Ni1 and Ni2 (i=0,1,2, . . . , n) and inverters IG0–IGn decode the inputted redundancy address RAi using the programming elements, and output the decoded redundancy address therefrom.

FIG. 3 is a timing diagram which illustrates operation of FIGS. 1 and 2. First, the address XAi of FIG. 3 is input to the address buffers 11 and 14. The inputted address XAi is synchronized to the synchronous signal KFRST of FIG. 3, so that the address signals Ai and RAi of FIG. 3 are produced. The redundancy decoder 15, to which the redundancy address RAi is input, decodes the redundancy address RAi during a period τ1, and outputs the address signal RPi therefrom.

Operation of the redundancy decoder 15 will now be described. First, the address of the defective memory cell address is programmed, utilizing the fuses Fi1 and Fi2 of the redundancy decoder 15, so that a defective normal memory cell can be replaced by a redundancy memory cell. In other words, the defective memory cell is replaced by the redundancy memory cell by blowing or programming the fuses Fi1 and Fi2 of the redundancy decoder 15 to correspond to the address of the defective normal memory cell. The fuse FE is also cut, to thereby activate the redundancy decoder 15.

In order to enable the redundancy decoder, the signal ZZPD is activated by a logic low level. When the signal ZZPD is at the logic low level, the PMOS transistor P1 is turned on and the NMOS transistor N1 is turned off. Also, if the fuse FE is blown, the node ZFE is at the logic low level. The signal at node ZFE at the logic low level is inverted to a logic high level by an inverter I1, thereby to turn on the NMOS transistor N2. Therefore, the signal of the node ZFE remains at the logic low level. When the signal of the node ZFE is at the logic low level, the PMOS transistor P2 is turned on and the signal of the node ZRR is at the logic high level.

In the above state, if the redundancy address RAi has the same programmed address as that of the fuses Fi1 and Fi2, the signal of the node ZRR is maintained at the logic high level, to thereby output the address signal RPi at the logic high level. However, if the inputted redundancy address RAi has a programmed address different from that of the fuses Fi1 and Fi2, the signal of the node ZRR is maintained at the logic low level, to thereby output the address signal RPi at the logic low level.

If the signal RPi is output from the redundancy decoder 15, the redundancy main word line decoder 16 synchronizes the inputted signal RPi to the synchronous signal KSCND1, thereby to output the redundancy word line RMWL as shown in FIG. 3 for selecting the redundancy main word line.

Unfortunately, the redundancy decoder 15 of FIG. 3 may create problems. First, when the fuses Fi1 and Fi2 are blown to program the redundancy address, the NMOS transistors Ni1 and Ni2 are enabled. Depending upon the identity of the redundancy address, one or more of the NMOS transistors are enabled. Since the sizes of the PMOS transistors P1 and P2 are constant, the delay time of the RPi signal can vary, based on the number of the NMOS transistors being enabled.

Referring to FIG. 4, the delay time at the time of enabling one NMOS transistor, and the RPi delay time variation will be described. It is assumed that the enable delay time and disable delay time of the signal RPi are respectively represented as "tA" and "tB" for one NMOS transistor, and that the enable delay time and disable delay time of the signal RPi are respectively represented as "tC" and "tD" for i NMOS transistors. Thus, the enable delay time of the signal RPi corresponds to τe=tC−tA and the disable delay time thereof corresponds to τd=tB−tD. Since the enable delay time tA cannot be faster than the disable delay time tB even if the sizes of the PMOS transistors are made larger in order to compensate the enable delay time tC of the signal RPi, the signal RPi has an output delay time corresponding to τ1=tC−tRA in order to prevent the erroneous operation of the signal RPi. The time τ1 represents a time delay at the time of decoding the redundancy address RAi in the redundancy decoder 15.

Second, a difference in loading based on the identity of the address, and a difference in the time τ2 based on number of the enabling NMOS transistors of the redundancy decoder 15, are respectively generated during the time t(XAi−RAi), thereby to generate an address skew. In other words, the main word line selection is generally faster than the redundancy main word line selection. If the speed of transferring the main word line from the enabling status to the disabling status does not become slower than the speed of transferring the redundancy main word line from the disabling status to the enabling status, a skew in simultaneously activating the main word line and the redundancy main word line may be generated. Accordingly, problems may be caused in which an access time is delayed by the difference τ4=τ2=τDU between the main word line and the redundancy main word line.

Finally, the set-up time and a hold time may be increased by as much as the time τDU in the synchronous semiconductor memory device, which is caused by a skew time τskew described above. Thus, when the address XAi of the main word line is at the logic high level, or the signal RPi is at the low level, the redundancy main word line is selected, to thereby simultaneously enable two word lines during the time τDU. Also, the enable current may increase during the time τDU.

SUMMARY OF THE INVENTION

It is therefore an object of the invention to provide redundancy decoding systems and methods for integrated circuit memory devices, which allow high speed selection of a redundancy word line in an integrated circuit memory device.

It is another object of the present invention to provide redundancy decoding systems and methods for integrated circuit memory devices, which allow correct timing of redundancy decoding.

These and other objects are provided, according to the present invention, by redundancy decoding systems and methods for integrated circuit memory devices which synchronize a redundancy decoding signal to allow the redundancy decoding signal to be output during an enabling period and to prevent output of the redundancy decoding signal otherwise. In particular, a redundancy decoder is synchronized to an output buffer so that the redundancy decoder generates a redundancy decoding signal during a time period which is independent of the identity of the programmed address. Accordingly, high speed selection of a redundancy word line is provided in synchronism with the conventional word line selection, so that address skew and improper operation of the redundancy system relative to the normal word line selection system is prevented.

In particular, according to the present invention, a redundancy decoder includes a plurality of programmable devices which collectively store a programmed address corresponding to a defective memory cell address. The plurality of programmable devices are responsive to an input address, to produce a redundancy decoding signal when the programmed address matches the input address. A redundancy decoding signal synchronizer allows the redundancy decoding signal to be output during an enabling period and prevents output of the redundancy decoding signal otherwise. The integrated circuit memory device includes an address buffer which produces the input address in synchronization with a first signal. The first signal is delayed by a first delay time to produce a second signal. The redundancy decoding signal synchronizer is responsive to the second signal, to allow the redundancy decoding signal to be output during the enabling period and to prevent output of the redundancy decoding signal otherwise.

The second signal is also preferably delayed by a second delay time to produce a third signal. The redundancy decoder preferably also includes a redundancy main word line decoder, which produces a redundant word line selection signal in response to the redundancy decoding signal. The redundancy main word line decoder is enabled by the third signal.

In a preferred embodiment of a redundancy decoder according to the present invention, the plurality of programmable devices are connected in parallel to define a common node. The redundancy decoding signal synchronizer is also connected to the common node so that the redundancy decoding signal is output at the common node during the enabling period, and to prevent output of the redundancy decoding signal at the common node otherwise. The redundancy decoding signal synchronizer preferably comprises a transistor, such as an NMOS transistor, having a controlling electrode (gate) and a pair of controlled electrodes (source and drain). The pair of controlled electrodes is connected between the common node and a reference voltage (such as ground voltage). The controlling electrode is connected to a synchronizing signal which deactivates the transistor during the enabling period and which activates the transistor otherwise. As already described, the synchronizing signal is preferably the first signal, delayed by a first delay time.

Accordingly, the synchronized redundancy decoder generates a redundancy decoding signal when the input address matches a programmed address which is stored therein, during a time period which is independent of the identity of the programmed address. Redundancy decoding systems and methods according to the invention can therefore be synchronized to the word line decoding system of the memory device, to thereby obtain high speed operation, prevent skew, double word line selection and other problems which may be found in conventional redundancy decoding systems and methods.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. Moreover, each embodiment described and illustrated herein includes its complementary (n or p type) embodiment as well.

In the description which follows, the term "KFRST" represents a first synchronous internal clock signal for synchronizing an input address XAi. The term "KFRST2" represents a second synchronous clock signal for synchronizing the signal Rpi. The "KFRST2" signal is a delayed signal KFRST. The term "KSCND1" represents a third synchronous clock signal for synchronizing the signal RPi, thereby selecting a redundancy main word line. The term "ZRR" is a common node which represents an output node of the redundancy decoding signal RPi.

Figure 1:
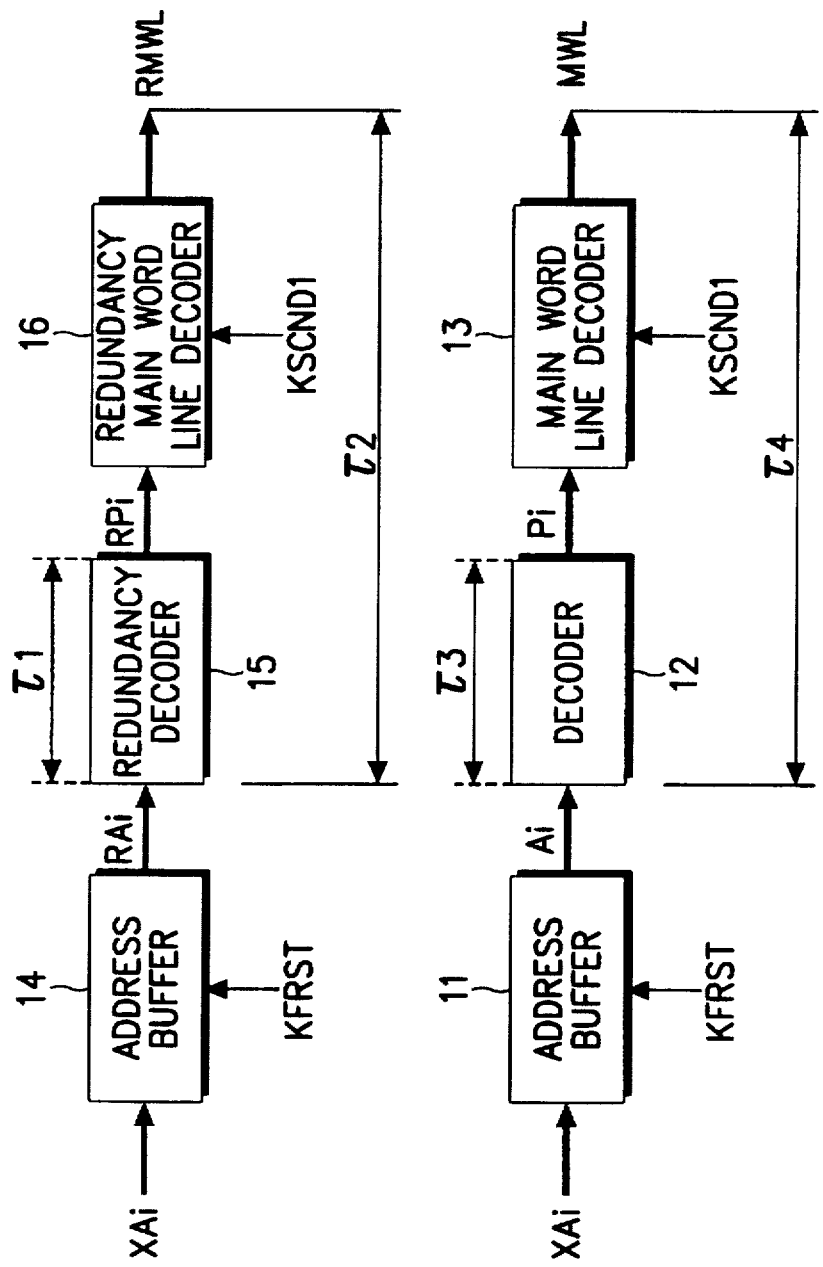
FIG. 1 is a block diagram of a conventional semiconductor memory device.
Figure 2:
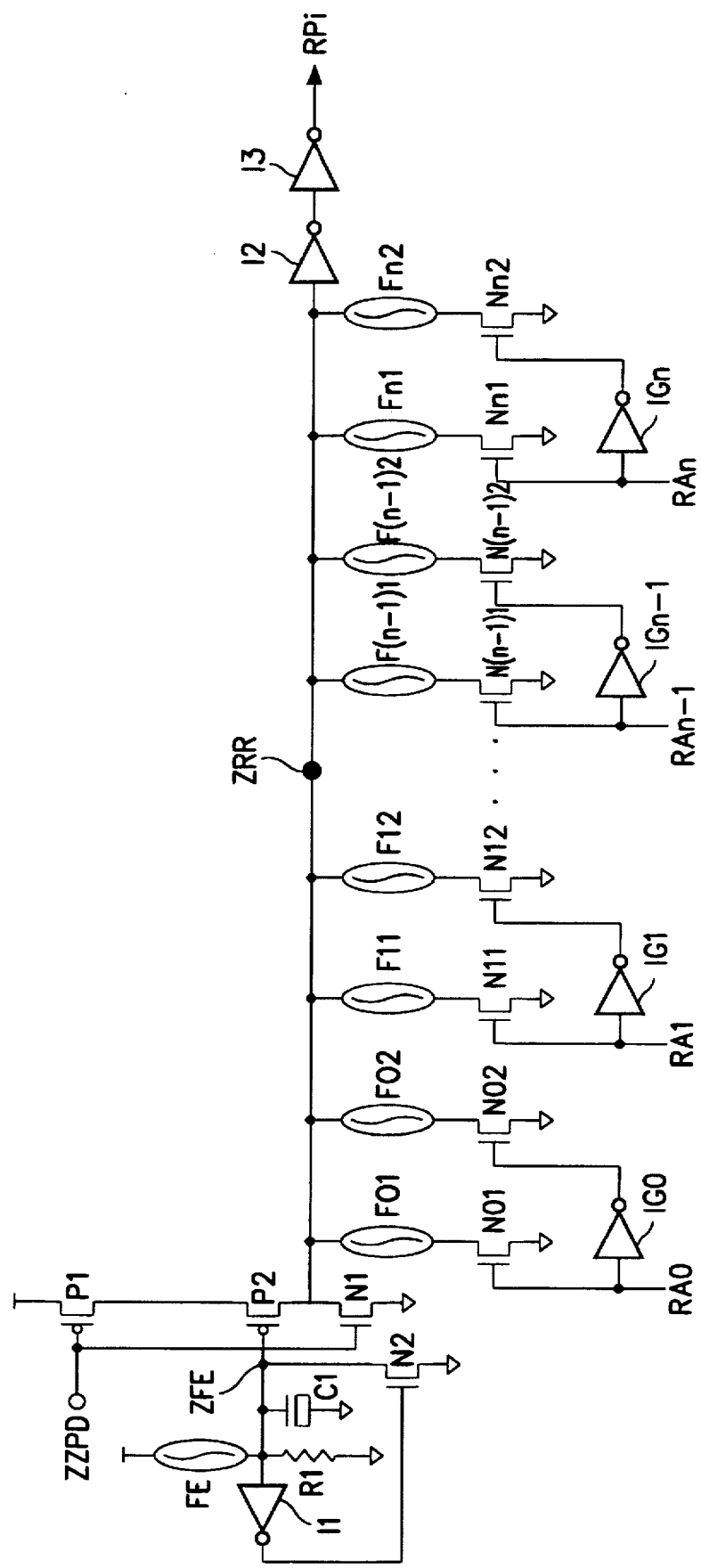
FIG. 2 is a circuit diagram of a redundancy decoder of FIG. 1.
Figure 3:
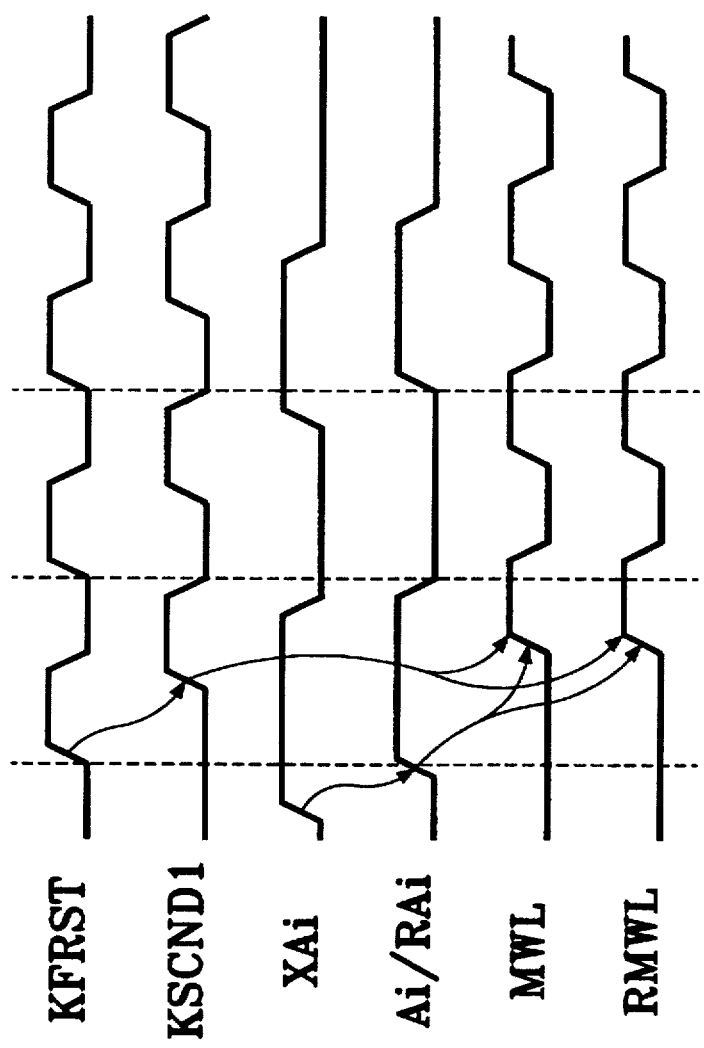
FIG. 3 is a timing diagram illustrating operation of FIGS. 1 and 2.
Figure 4:
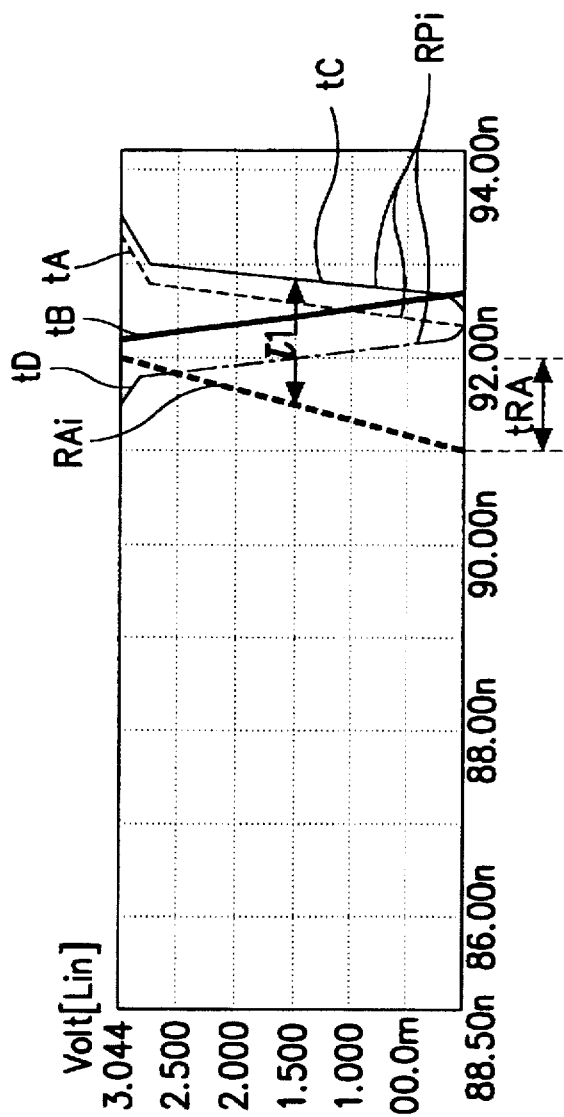
FIG. 4 is a graphical illustration of waveforms illustrating a time delay at the time of performing a redundancy operation in a conventional semiconductor memory device.
Figure 5:
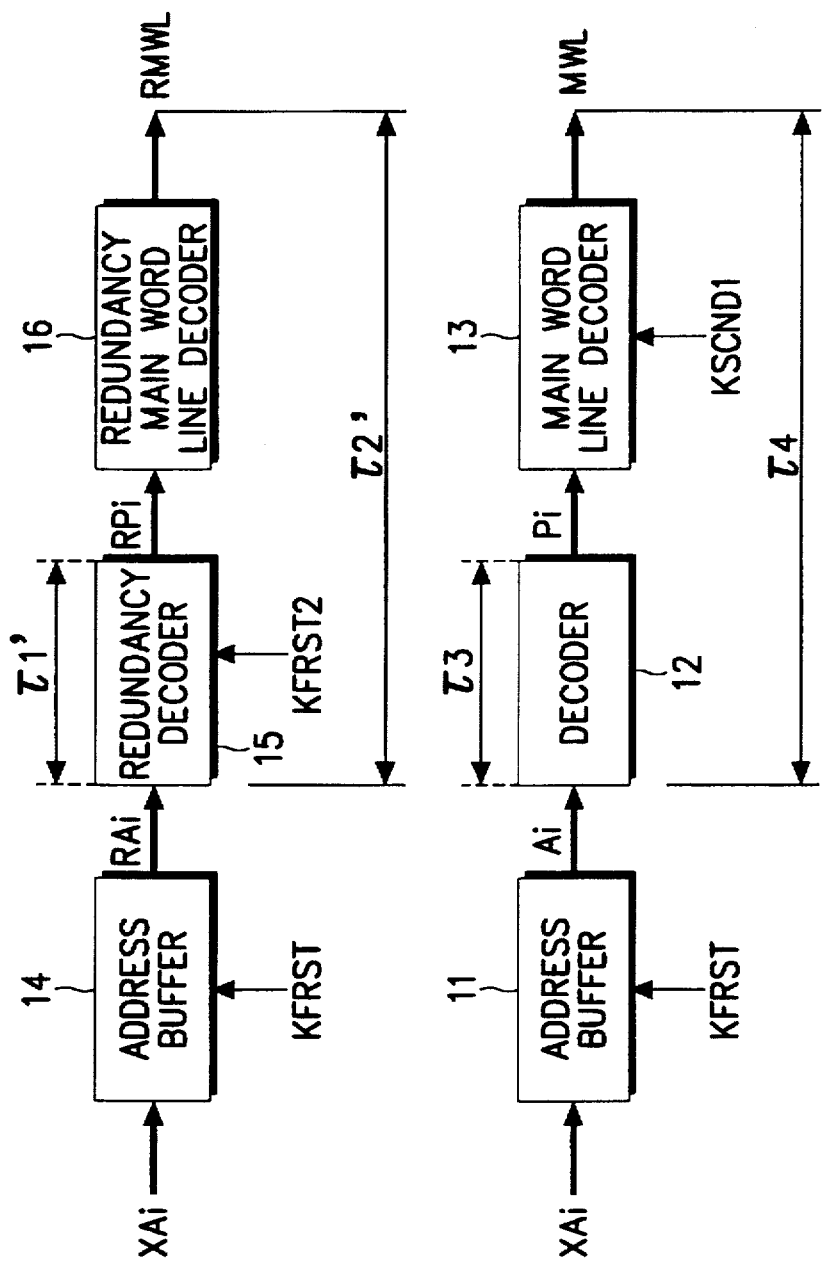
FIG. 5 is a block diagram of a semiconductor memory device according to the present invention.

FIG. 5 is a block diagram of a redundancy decoding system for selecting a normal word line and a redundancy word line according to the present invention. Selection of a normal word line will first be described. The address buffer 11 synchronizes a received address XAi to the synchronous signal KFRST, to thereby output the synchronized address XAi therefrom. An address signal Ai is output from an address buffer 11. A decoder 12 decodes the address signal Ai, to thereby output a decoding signal Pi therefrom. The main word line decoder 13 synchronizes the decoding signal Pi to the synchronous signal KSCND1, to thereby select a corresponding normal word line MWL.

Selection of a redundancy word line will now be described. An address buffer 14 synchronizes an input address XAi to the synchronous signal KFRST, to thereby output the synchronized signal XAi therefrom. The redundancy address signal RAi is output from the address buffer 14. A redundancy decoder 15 decodes and synchronizes the redundancy address RAi to the synchronous signal KFRST2, to thereby output the redundancy decoding signal RPi therefrom. The redundancy main word line decoder 16 synchronizes the redundancy decoding signal RPi to the synchronous signal KSCND1, to thereby select a corresponding redundancy word line RMWL. It will be understood by those having skill in the art that although two separate address buffers 14 and 15 are illustrated in FIG. 5, a single address buffer can be used to synchronize a received address XAi to a synchronous signal KFRST.

Since the redundancy decoder 15 and the decoder 12 are different from each other, the redundancy decoder 15 and the decoder 12 have delay times of τ1' and τ3 respectively, from the time the redundancy address RAi and the address Ai are input. Accordingly, it takes times of τ2' and τ4 respectively, for the redundancy word line RMWL and the normal word line MWL to be respectively selected.

Figure 6:
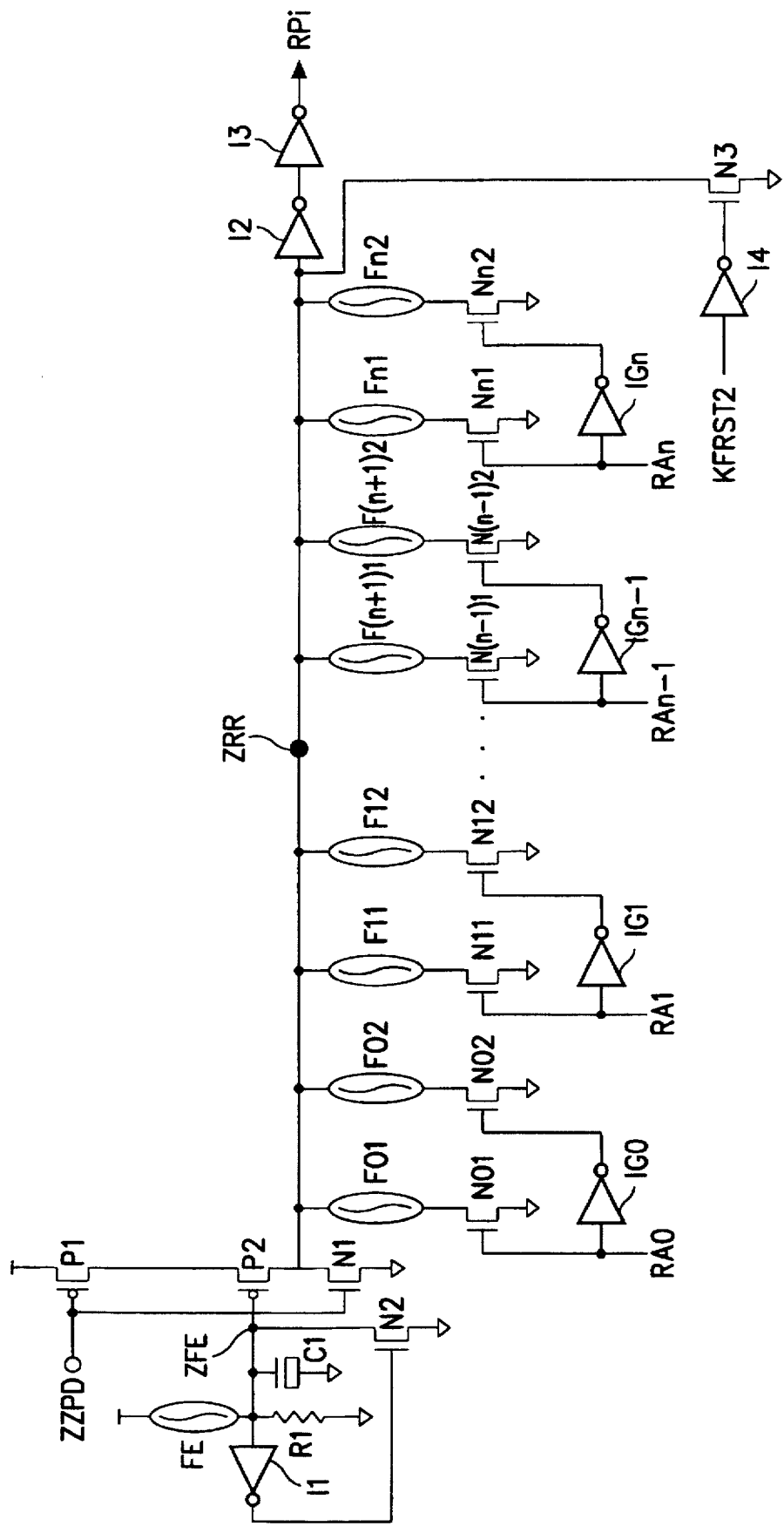
FIG. 6 is a circuit diagram of a redundancy decoder of FIG. 5.

FIG. 6 is a circuit diagram of the redundancy decoder 15 of FIG. 5. A fuse FE is blown or programmed when a corresponding redundancy decoder 15 is programmed. Accordingly, the fuse FE, a resistor R1, an MOS capacitor C1, an inverter I1, an NMOS transistor N2 and a PMOS transistor P2 which are connected to a node ZFE, indicate whether the redundancy decoder 15 is programmed. Also, the PMOS transistor P1 and the NMOS transistor N1, connected to the node ZRR, are switched in response to a signal ZZPD which is activated in an enabling mode, to thereby indicate an enabling state of the node ZRR. The fuses Fi1 and Fi2 (i=0,1,2, . . . , n) are elements for programming the redundancy address RPi in order to select the redundancy word line for defect repair. The NMOS transistors Ni1 and Ni2 (i=0,1,2, . . . , n) and inverters IG0–IGn decode the inputted redundancy address RAi using the programming elements, and output the decoded redundancy address therefrom.

The inverter I4 inverts and outputs the synchronous signal KFRST2 therefrom. The NMOS transistor N3 is connected between the node ZRR and a reference voltage such as ground voltage, and the gate electrode thereof is connected to the output terminal of the inverter I4. The inverter I4 and the NMOS transistor N3 synchronize the signal RPi to the synchronous signal KFRST2, to thereby output the synchronized signal RPi therefrom.

Figure 7:
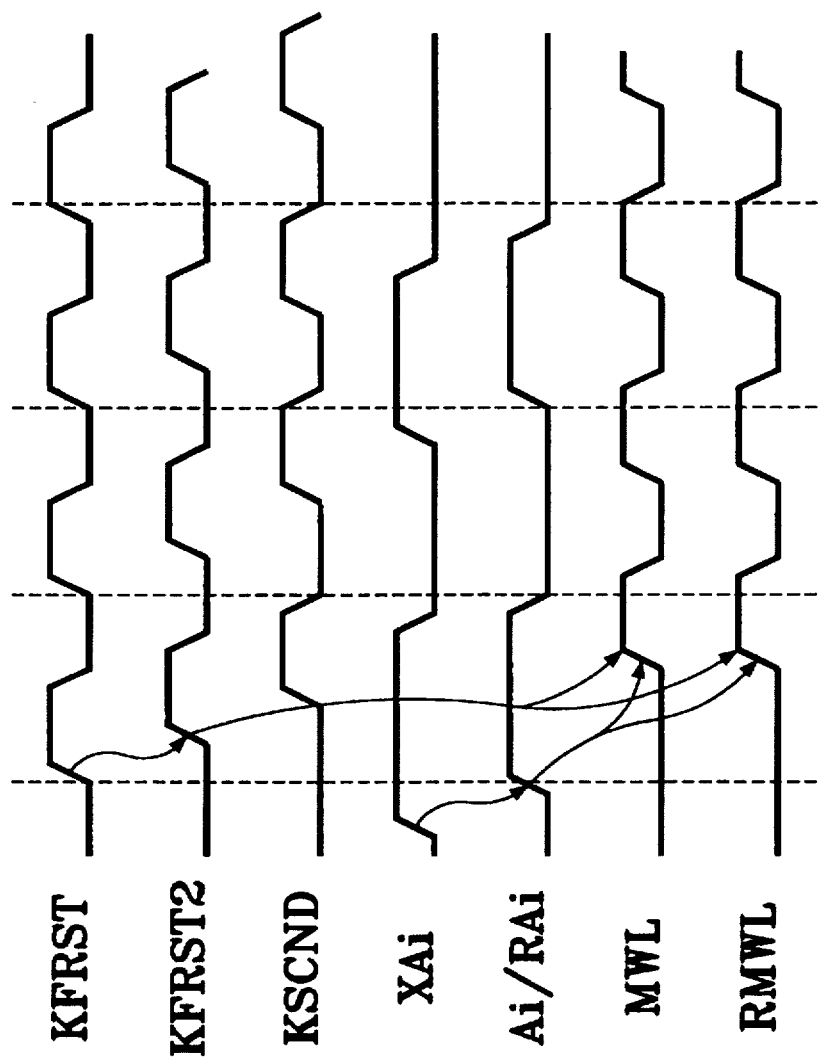
FIG. 7 is a timing diagram illustrating operation of FIGS. 5 and 6.

FIG. 7 is a timing diagram illustrating operation of FIGS. 5 and 6. First, when the address XAi is input to the address buffers 11 and 14, the input address XAi is synchronized to the first synchronous signal KFRST of FIG. 7, so that the address signals Ai and RAi from the address buffers 11 and 14 are produced. The redundancy decoder 15 synchronizes the redundancy address RAi to a second synchronous signal KFRST2, to thereby output the decoded signal RPi therefrom.

Referring to FIG. 6, the address of the defective normal memory cell is programmed, utilizing the fuses Fi1 and Fi2 of the redundancy decoder 15, so that a defective normal memory cell can be replaced by a redundancy memory cell. The fuse FE is programmed, to thereby set the redundancy decoder 15 in an active state. When the signal ZZPD is at the logic low level, the PMOS transistor P1 is turned on and the NMOS transistor N1 is turned off. Also, if the fuse FE is blown, the node ZFE is at the logic low level. The signal at node ZFE at the logic low level is inverted to a logic high level by the inverter I1, to thereby turn on the NMOS transistor N2. Therefore, the signal of the node ZFE remains at the logic low level. When the signal of the node ZFE is at the logic low level, the PMOS transistor P2 is turned on, to thereby bring the node ZRR to the logic high level.

In the above state, if the redundancy address RAi is the same programmed address as that of the fuses Fi1 and Fi2, the signal of the node ZRR is maintained at the logic high level, to thereby output the address signal RPi having the logic high level. However, if the input redundancy address RAi has a programmed address different from that of the fuses Fi1 and Fi2, the signal of the node ZRR is maintained at the logic low level, thereby to output the address signal RPi at the logic low level.

As shown in FIG. 7, the second synchronous signal KFRST2 is a delayed version of the first synchronous signal KFRST. The inverter I4 inverts the second synchronous signal KFRST2, thereby to output the inverted signal /KFRST2 therefrom. Since the inverted signal /KFRST2 is applied to the gate electrode of the NMOS transistor N3, the signal RPi of the node ZRR is synchronized to the second synchronous signal KFRST2.

As also shown in FIG. 7, since the time t(XAi–RAi) is smaller than the time t(KFRST–KFRST2), that is, t(XAi–RAi)<t(KFRST–KFRST2), the output signal of the node ZRR is determined by the second synchronous signal KFRST2. In other words, when the second synchronous signal KFRST2 is at the logic low level, the NMOS transistor N3 is turned on so that the signal RPi of the node ZRR is at the logic low level. When the second synchronous signal KFRST2 is at the logic high level, the NMOS transistor N3 is turned off so that the logic level of the signal RPi and of the node ZRR is determined based upon the status of the programmed address and the address RAi.

Figure 8:
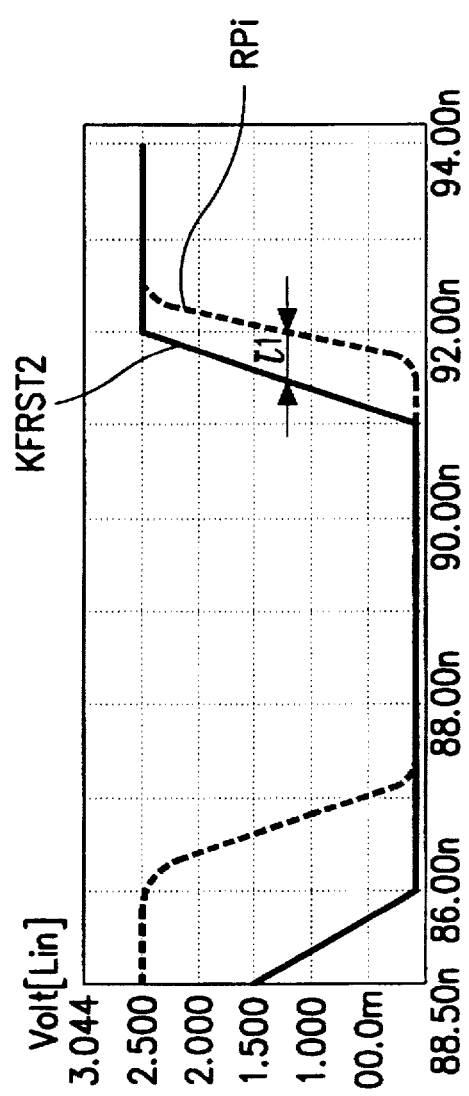
FIG. 8 is a graphical illustration of waveforms illustrating a time delay at the time of performing a redundancy operation in a semiconductor memory device according to the present invention.

Accordingly, the margin of the enable and the disable of the signal RPi need not be considered, since the signal RPi is synchronized with the second synchronous signal KFRST2. In other words, as shown in the dotted line of FIG. 8, the enable delay time τ1' of the redundancy decoder 15 can be made faster since the margin of the enable and the disable need not be considered (τ1'<<τ1). Also, since the redundancy decoder 15 outputs the signal RPi therefrom, as synchronized by the synchronous signal KFRST2, address skew based on respective address differences is not generated.

In FIG. 5, if the time delay of the signals KSCND1 and KFRST2 is controlled so that the time τ1'–τ3 is equal to the time t(KSCND1)–t(KFRST2), the time τ2' becomes equal to the time τ4. The difference between the word line selection time of a repair memory cell and a normal memory cell is thereby reduced or eliminated. Selection of two word lines by the word line of the repair memory cell is reduced or prevented. An increase in the enable current is prevented, and improved set-up time and a hold time is provided. Accordingly, redundancy decoding systems and methods of the present invention prevent the enable current from being increased by the enable delay time, prevent address skew and double word line selection, and allow improved set-up time and hold time.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A redundancy decoding system for an integrated circuit memory device, comprising:

a plurality of programmable devices which collectively store a programmed address corresponding to a defective memory cell address, wherein the plurality of programmable devices are responsive to an input address to produce a redundancy decoding signal when the programmed address matches the input address; and a redundancy decoding signal synchronizer, which allows the redundancy decoding signal to be output during an enabling period, and which prevents output of the redundancy decoding signal otherwise.

2. A redundancy decoding system according to claim 1 further comprising:

an address buffer which produces the input address in synchronization with a first signal;

the redundancy decoding signal synchronizer being responsive to a second signal to allow the redundancy decoding signal to be output during the enabling period, and to prevent output of the redundancy decoding signal otherwise; and wherein the second signal is the first signal, delayed by a first delay time.

3. A redundancy decoding system according to claim 1 wherein the plurality of programmable devices are connected in parallel to define a common node, and wherein the redundancy decoding signal synchronizer is also connected to the common node to allow the redundancy decoding signal to be output at the common node during the enabling period, and to prevent output of the redundancy decoding signal at the common node otherwise.

4. A redundancy decoding system according to claim 3 wherein the redundancy decoding signal synchronizer comprises a transistor having a controlling electrode and a pair of controlled electrodes, wherein the pair of controlled electrodes is connected between the common node and a reference voltage, and wherein the controlling electrode is connected to a synchronizing signal which deactivates the transistor during the enabling period and which activates the transistor otherwise.

5. A redundancy decoding system for an integrated circuit memory device, comprising:

a redundancy address buffer which receives an input address; and a synchronized redundancy decoder, responsive to the input address, which generates a redundancy decoding signal when the input address matches a programmed address which is stored therein, during a time period which is independent of the identity of the programmed address.

6. A redundancy decoding system according to claim 5 wherein the synchronized redundancy decoder comprises:

a plurality of programmable devices which collectively store the programmed address corresponding to a defective memory cell address, wherein the plurality of programmable devices are responsive to the input address to produce the redundancy decoding signal when the programmed address matches the input address at a time which is dependent upon the identity of the programmed address; and a redundancy decoding signal synchronizer, which allows the redundancy decoding signal to be output during the time period which is independent of the identity of the programmed address, and which prevents output of the redundancy decoding signal otherwise.

7. A redundancy decoding system according to claim 6:

wherein the address buffer produces the input address in synchronization with a first signal;

wherein the redundancy decoding signal synchronizer is responsive to a second signal to allow the redundancy decoding signal to be output during the time period which is independent of the identity of the programmed address, and to prevent output of the redundancy decoding signal otherwise; and wherein the second signal is the first signal, delayed by a first delay time.

8. A decoding system for an integrated circuit memory device, comprising:

a decoder, responsive to an input address, which generates a decoding signal;

a main word line decoder, responsive to the decoder, which produces a word line selection signal in response to the decoding signal;

a redundancy decoder, responsive to the input address, which generates a redundancy decoding signal when the input address matches a programmed address which is stored therein; and a redundant word line decoder, responsive to the redundancy decoder, which produces a redundancy word line selection signal in response to the redundancy decoding signal;

the word line selection signal and the redundant word line selection signal being produced synchronously, notwithstanding the identity of the input address.

9. A decoding system according to claim 8 wherein the redundancy decoder comprises:

a plurality of programmable devices which collectively store the programmed address corresponding to a defective memory cell address, wherein the plurality of programmable devices are responsive to the input address to produce a redundancy decoding signal when the programmed address matches the input address; and a redundancy decoding signal synchronizer, which allows the redundancy decoding signal to be output during an enabling period, and which prevents output of the redundancy decoding signal otherwise.

10. A decoding system according to claim 9 further comprising:

an address buffer which produces the input address in synchronization with a first signal;

the redundancy decoding signal synchronizer being responsive to a second signal to allow the redundancy decoding signal to be output during the enabling period, and to prevent output of the redundancy decoding signal otherwise; and wherein the second signal is the first signal, delayed by a first delay time.

11. A redundancy decoding method for an integrated circuit memory device, including a plurality of programmable devices which collectively store a programmed address corresponding to a defective memory cell address, the redundancy decoding method comprising the steps of:

applying an input address to the plurality of programmable devices to produce a redundancy decoding signal when the programmed address matches the input address; and synchronizing the redundancy decoding signal, to allow the redundancy decoding signal to be output during an enabling period, and to prevent output of the redundancy decoding signal otherwise.

12. A redundancy decoding method according to claim 11 wherein the integrated circuit memory device further comprises an address buffer which produces the input address in synchronization with a first signal, and wherein the synchronizing step comprises the steps of:

delaying the first signal by a first delay time to produce a second signal; and synchronizing the redundancy decoding signal to the second signal, to allow the redundancy decoding signal to be output synchronous with the second signal, and to prevent output of the redundancy decoding signal otherwise.

13. A redundancy decoding method for an integrated circuit memory device, the integrated circuit memory device including a redundancy address buffer which receives an input address, and a redundancy decoder, responsive to the input address, which generates a redundancy decoding signal when the input address matches a programmed address which is stored therein, the redundancy decoding method comprising the step of:

synchronizing the redundancy decoder to the redundancy address buffer such that the redundancy decoder generates the redundancy decoding signal during a time period which is independent of the identity of the programmed address.

14. A redundancy decoding method according to claim 13 wherein the redundancy decoder comprises a plurality of programmable devices which collectively store the programmed address corresponding to a defective memory cell address, wherein the plurality of programmable devices are responsive to the input address to produce the redundancy decoding signal when the programmed address matches the input address; and wherein the synchronizing step comprises the step of:

allowing the redundancy decoding signal to be output during the time period which is independent of the identity of the programmed address, and preventing output of the redundancy decoding signal otherwise.

15. A redundancy decoding method according to claim 14 wherein the address buffer produces the input address in synchronization with a first signal, the redundancy decoding method further comprising the steps of:

delaying the first signal by a first delay time to produce the second signal; and synchronizing the redundancy decoding signal to the second signal to allow the redundancy decoding signal to be output during the time period which is independent of the identity of the programmed address, and to prevent output of the redundancy decoding signal otherwise.

\* \* \* \* \*